United States Patent
Chen

(10) Patent No.: US 8,258,536 B2
(45) Date of Patent: Sep. 4, 2012

(54) LIGHT EMITTING MODULE

(75) Inventor: Ga-Lane Chen, Santa Clara, CA (US)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 947 days.

(21) Appl. No.: 12/261,215

(22) Filed: Oct. 30, 2008

(65) Prior Publication Data

US 2009/0261352 A1    Oct. 22, 2009

(30) Foreign Application Priority Data

Apr. 17, 2008   (CN) .......................... 2008 1 0301175

(51) Int. Cl.
*H01L 29/18* (2006.01)
(52) U.S. Cl. ....... 257/99; 257/81; 257/88; 257/E33.001; 257/E33.056; 438/28; 438/34
(58) Field of Classification Search ............. 362/311.02, 362/800, 84, 183, 555; 257/431, 433, 444, 257/461, 462, 466, 80–83, 99, 88, E33.001, 257/E33.056; 438/26, 28, 34
See application file for complete search history.

(56) References Cited

U.S. PATENT DOCUMENTS

| 5,938,312 | A  | * | 8/1999 | Ishinaga ......................... 362/29 |
| 6,784,357 | B1 |   | 8/2004 | Wang |
| 2008/0230115 | A1 | * | 9/2008 | Kannou et al. ................ 136/252 |

FOREIGN PATENT DOCUMENTS

| CN | 1416179 A | 5/2003 |
| CN | 1949624 A | 4/2007 |
| JP | 2001351418 A | * 12/2001 |

* cited by examiner

*Primary Examiner* — Jerome Jackson, Jr.
*Assistant Examiner* — Jose R Diaz
(74) *Attorney, Agent, or Firm* — Altis Law Group, Inc.

(57) ABSTRACT

A light emitting module includes a dielectric substrate, a solar cell unit, a metal pattern layer, light emitting units, and a power storage component. The dielectric substrate has a first surface and a second surface opposite to the first surface. The solar cell unit is positioned on the first surface. The metal pattern layer is positioned on the second surface. The light emitting units is positioned on the metal pattern layer. The power storage component includes a power charge port electrically coupled to the solar cell unit, and a power supply port electrically coupled to the metal pattern layer.

10 Claims, 14 Drawing Sheets

US 8,258,536 B2

LIGHT EMITTING MODULE

CROSS-REFERENCE STATEMENT

The present application is based on, and claims priority from, CN Application Serial Number 200810301175.0, filed on Apr. 17, 2008, titled "LIGHT EMITTING MODULE", the disclosure of which is hereby incorporated by reference herein in its entirety.

BACKGROUND

1. Technical Field

The present disclosure relates to a light emitting module.

2. Description of Related Art

Currently, various solar cells have been designed to receive and convert sunlight into electrical energy. Some solar cells are used in light emitting modules as power sources. However, the light emitting modules have large complicated structures.

Therefore, a new light emitting module is desired to overcome the above-described shortcoming.

SUMMARY

An embodiment of a light emitting module includes a dielectric substrate, a solar cell unit, a metal pattern layer, a plurality of light emitting units, and a power storage component. The dielectric substrate has a first surface and a second surface opposite to the first surface. The solar cell unit is positioned on the first surface. The metal pattern layer is positioned on the second surface. The plurality of light emitting units is positioned on the metal pattern layer. The power storage component includes a power charge port electrically coupled to the solar cell unit, and a power supply port electrically coupled to the metal pattern layer.

Other advantages and novel features will become more apparent from the following detailed description when taken in conjunction with the accompanying drawings.

BRIEF DESCRIPTION OF THE DRAWINGS

Many aspects of the light emitting module can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION OF THE EMBODIMENTS

Figure 1:
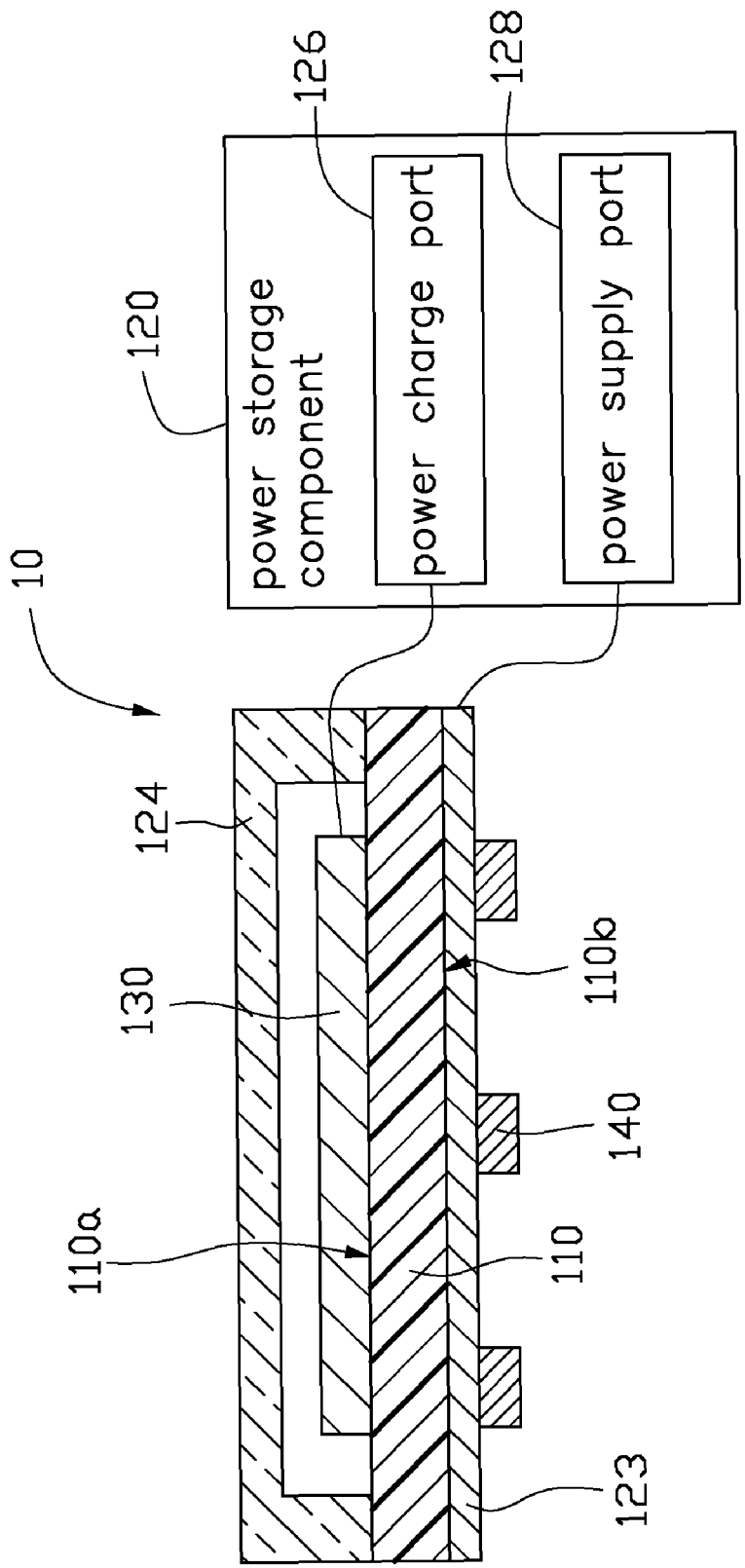
FIG. 1 is a cross-sectional view of a first embodiment of a light emitting module.

Referring to FIG. 1, a first embodiment of a light emitting module 10 includes a dielectric substrate 110, a power storage component 120, a solar cell unit 130, a transparent package component 124, a metal pattern layer 123, and a plurality of light emitting units 140.

The dielectric substrate 110 has a first surface 110a and a second surface 110b opposite to the first surface 110a. The solar cell unit 130 is positioned on the first surface 110a. The transparent package component 124 is secured on the dielectric substrate 110 and encloses the solar cell unit 130 therein. The metal pattern layer 123 is positioned on the second surface 110b. The plurality of light emitting units 140 is positioned on the metal pattern layer 123. The power storage component 120 includes a power charge port 126 and a power supply port 128. The power charge port 126 is electrically coupled to the solar cell unit 130. The power supply port 128 is electrically coupled to the metal pattern layer 123.

The dielectric substrate 110 may be made of a material such as polyimide, polyethylene terephthalate, polycarbonate, polymethyl methacrylate, ceramic, glass, and quartz. In this embodiment, the dielectric substrate 110 is made of a glass material.

The power storage component 120 may be a lead-acid battery, lithium ion battery, nickel metal hydride battery, or capacitor. In this embodiment, the power storage component 120 is a lithium ion battery.

Each light emitting unit 140 may be a light emitting diode (LED) chip, an LED, or an incandescent lamp. In this embodiment, each light emitting unit 140 is an LED chip.

Figure 2:
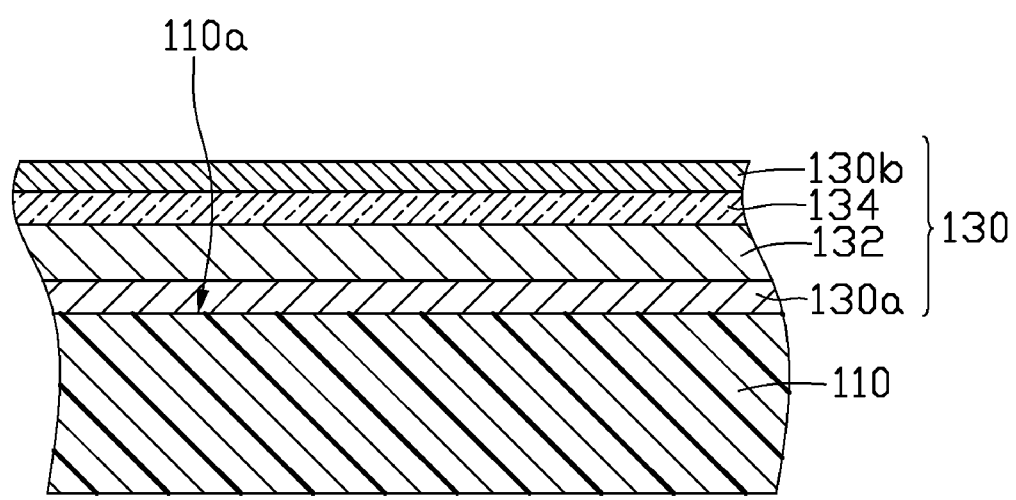
FIG. 2 is a partial enlarged cross-sectional view of the light emitting module of FIG. 1.

Referring to FIG. 2, the solar cell unit 130 is configured to convert sunlight into electrical energy and supply the electrical energy to the power storage component 120. The solar cell unit 130 sequentially includes a rear electrode layer 130a contacting the first surface 110a, a photovoltaic semiconductor layer 132, a transparent conductive layer 134, and a front surface electrode 130b. The rear electrode layer 130a and the front surface electrode 130b are electrically coupled to the power charge port 126.

The rear electrode layer 130a may be made of a material such as silver (Ag), copper (Cu), molybdenum (Mo), aluminum (Al), Cu—Al alloy, Ag—Cu alloy, and Cu—Mo alloy. The rear electrode layer 130a may be coated on the dielectric substrate 110 by, for example, a sputtering or depositing method.

The photovoltaic semiconductor layer 132 is configured to convert sunlight to electrical energy. In one embodiment, the photovoltaic semiconductor layer 132 may includes an N-type semiconductor layer, a P-type semiconductor layer, and a PN junction layer formed between the N-type semiconductor layer and the P-type semiconductor layer. The N-type semiconductor layer may be made of N-type hydrogenated amorphous silicon. The P-type semiconductor layer may be made of P-type hydrogenated amorphous silicon.

The transparent conductive layer 134 may be made of indium tin oxide (ITO) or zinc oxide. In this embodiment, the transparent conductive layer 134 is made of ITO.

Figure 3:
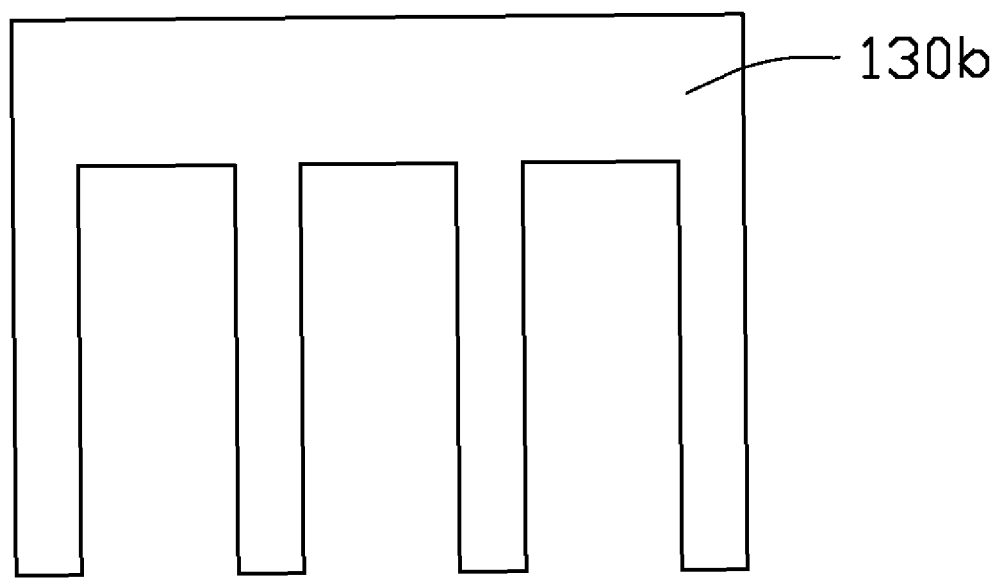
FIG. 3 is a perspective view of a front electrode layer of the light emitting module of FIG. 1.

Referring to FIG. 3, the front electrode layer 130b may be comb-shaped and made of a material such as Ag, Cu, Mo, Al, Cu—Al alloy, Ag—Cu alloy, and Cu—Mo ally.

Figure 4:
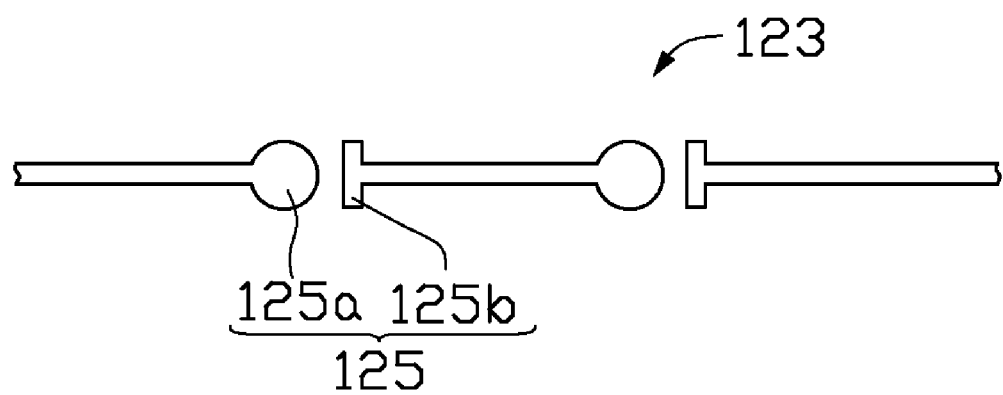
FIG. 4 is a perspective view of two pairs of electrode pads of the light emitting module of FIG. 1.

Referring to FIG. 4, the metal pattern layer 123 includes a plurality of pairs of electrode pads 125. Each pair of electrode pads 125 is configured to be coupled to a corresponding light emitting unit 140125, and includes a positive electrode pad 125a and a negative electrode pad 125b connected to a positive electrode pad 125a of an adjacent pair of electrode pads 125.

In use, sunlight passes through the transparent package component 124 and is collected by the solar cell unit 130. The solar cell unit 130 converts the sunlight to an electrical energy. The electrical energy is delivered to and stored in the power storage component 120. The stored electrical energy is supplied to the plurality of light emitting units 140 via the power supply port 128 when the plurality of light emitting units 140 is turned on.

Figure 5:
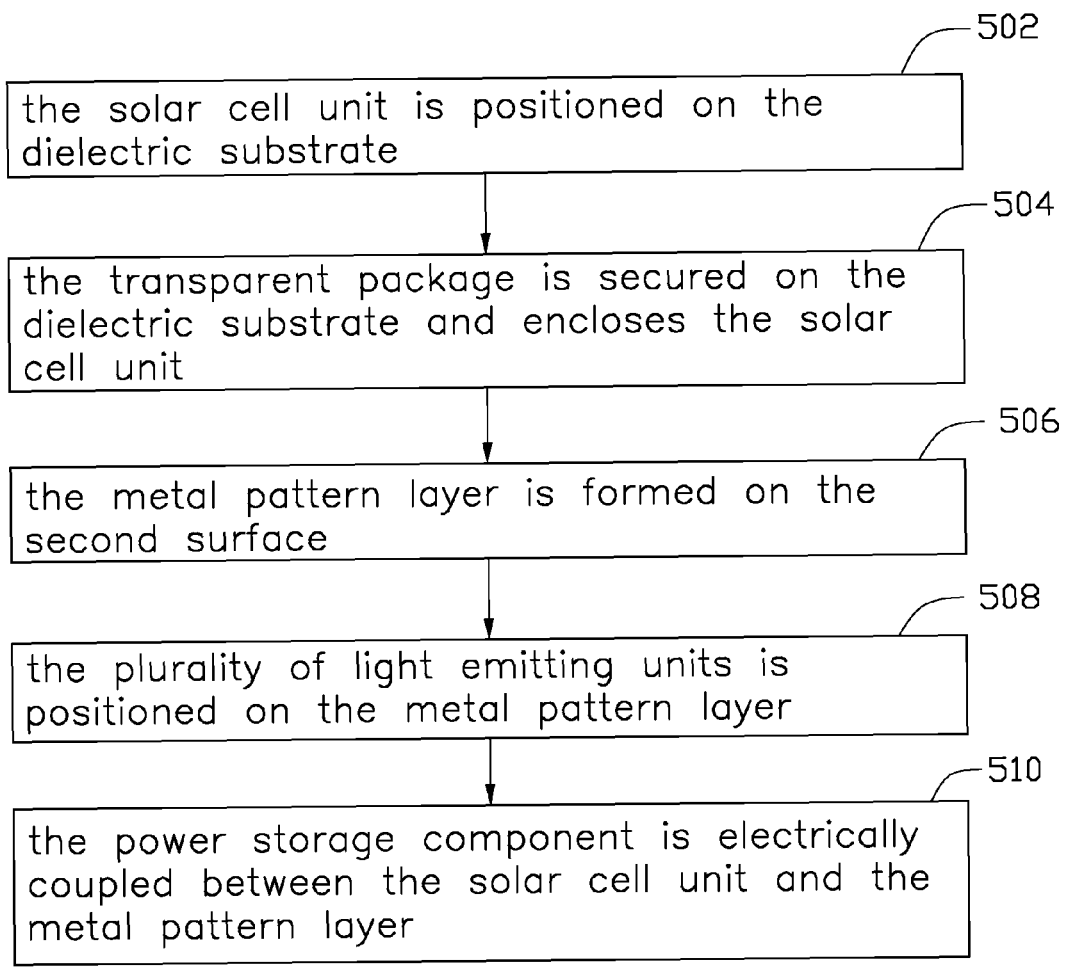
FIG. 5 is a flowchart of one embodiment of a method for fabricating the light emitting module of FIG. 1.

Referring to FIG. 5, one embodiment of a method for fabricating the light emitting module 10 of FIG. 1 is provided. Depending on the embodiment, certain of the steps described below may be removed, others may be added, and the sequence of steps may be altered.

In step 502, the solar cell unit 130 is positioned on the dielectric substrate 110. The rear electrode layer 130a, the photovoltaic semiconductor layer 132, the transparent conductive layer 134, and the front electrode layer 130b are sequentially formed on the first surface 110a of the dielectric substrate 110.

In step 504, the transparent package component 124 is secured on the dielectric substrate 110 and encloses the solar cell unit 130.

Continuing to step 506, the metal pattern layer 123 is formed on the second surface 110b.

In step 508, the plurality of light emitting units 140 is secured on the metal pattern layer 123.

Moving to step 510, the power storage component 120 is electrically coupled between the solar cell unit 130 and the metal pattern layer 123. A positive electrode of the power charge port 126 is electrically coupled to the rear electrode layer 130b. A negative electrode of the power charge port 126 is electrically coupled to the front electrode layer 130a. A positive electrode of the power supply port 128 is electrically coupled to the positive electrode pad 125a. A negative electrode of the power supply port 128 is electrically coupled to the negative electrode pad 125b.

Figure 6:
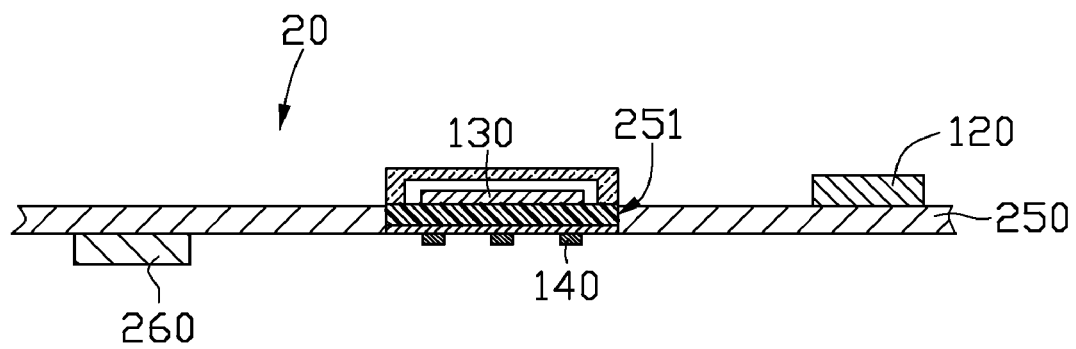
FIG. 6 is a partial cross-sectional view of a second embodiment of a light emitting module.

Referring to FIG. 6, a second embodiment of a light emitting module 20 is similar to the first embodiment of the light emitting module 10 of FIGS. 1-4, except that the light emitting module 20 further includes a printed circuit board (PCB) 250 and a controller 260.

A through hole 251 is defined in the PCB 250. The dielectric substrate 110 is received in the through hole 251. The power storage component 120 is positioned on the PCB 250.

Figure 7:
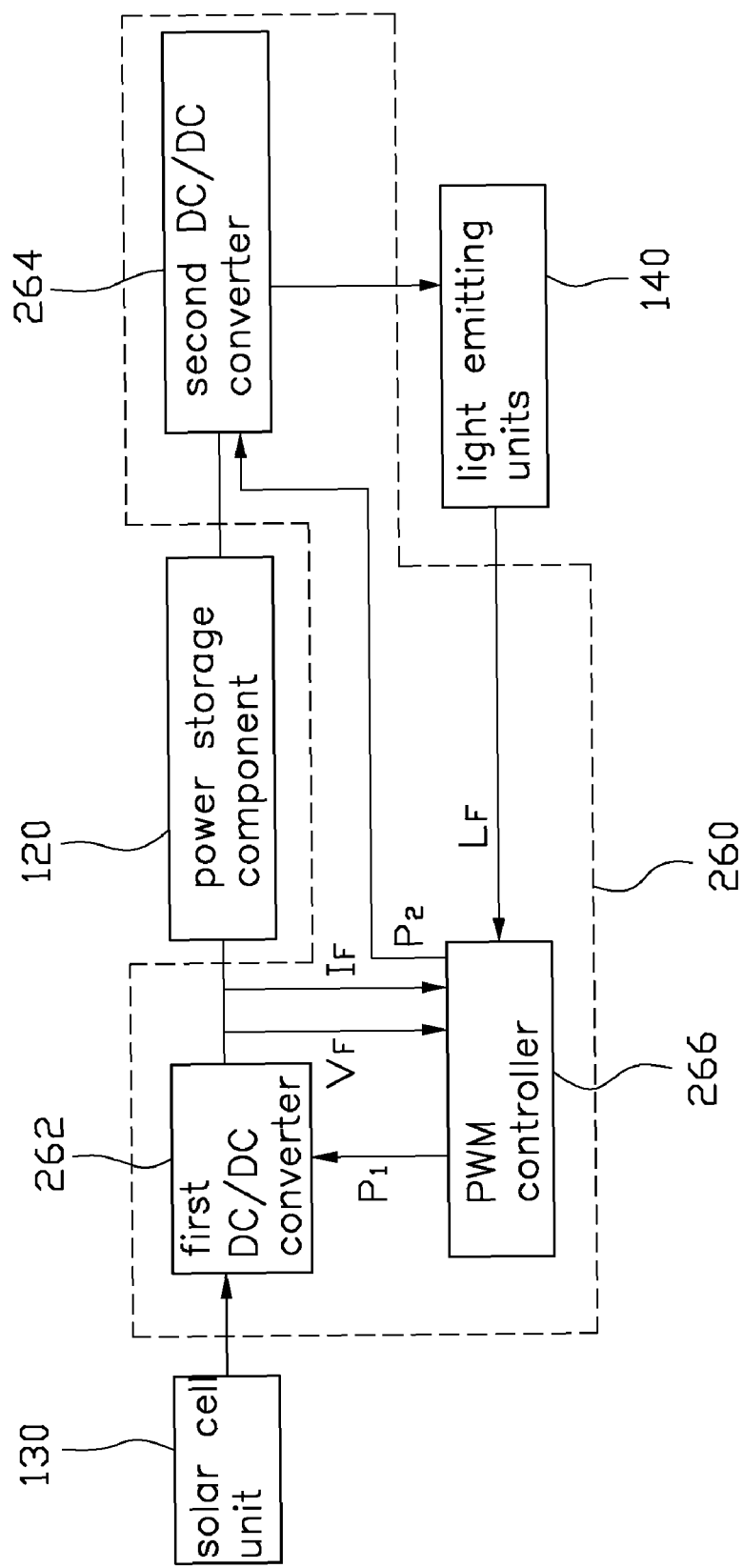
FIG. 7 is a circuit diagram of the light emitting module of FIG. 6.

The controller 260 is positioned on the PCB 250 and configured to control the solar cell unit 130 to charge the power storage component 120 and the power storage component 120 to supply power to the light emitting units 140. Referring to FIG. 7, the controller 260 includes a first direct current (DC)/DC converter 262, a second DC/DC converter 264 and a pulse width modulation (PWM) controller 266. The first DC/DC converter 262 is electrically coupled between the solar cell unit 130 and the power storage component 120. The second DC/DC converter 264 is electrically coupled between the power storage component 120 and the light emitting units 140. The PWM controller 266 is electrically coupled to the first DC/DC converter 262, the power storage component 120, the second DC/DC converter 264, and the light emitting units 140. During use, when a voltage feedback signal $V_F$ and a current feedback signal $I_F$ are received from the power storage component 120, the PWM controller 266 sends a first PWM output signal $P_1$ to the first DC/DC converter 262 so that the solar cell unit 130 charges the power storage component 120. When a feedback signal $L_F$ is received from the light emitting units 140, the PWM controller 266 sends a second PWM output signal $P_2$ to the second DC/DC converter 264 so that the power storage component 120 supplies power to the light emitting units 140.

Figure 8:
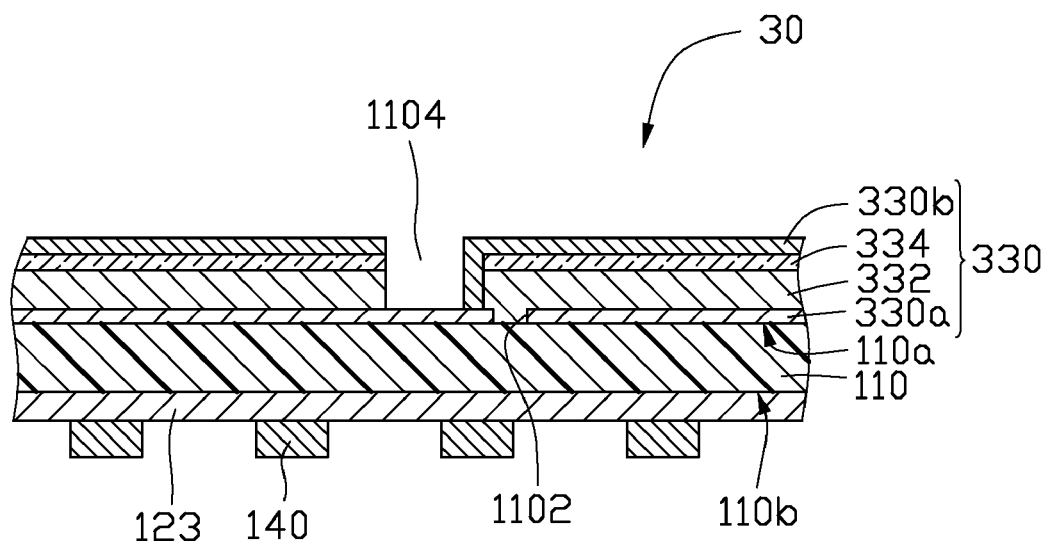
FIG. 8 is a partial enlarged cross-sectional view of a third embodiment of a light emitting module.

Referring to FIG. 8, a third embodiment of a light emitting module 30 is similar to the light emitting module 10 of FIGS. 1-4, except that the light emitting module 30 includes a plurality of solar cell units 330. Each solar cell unit 330 is positioned on the dielectric substrate 110 and enclosed in the transparent package component 124. Each pair of adjacent solar cell units 330 are electrically connected in series with each other. A rear electrode layer 330a is spaced apart from another adjacent rear electrode layer 330a. Similarly, a front electrode layer 330b is spaced apart from another adjacent front electrode layer 330b. The rear electrode layer 330a of the solar cell unit 330 is electrically coupled to a front electrode layer 330b of an adjacent solar cell unit 330.

Figure 9:
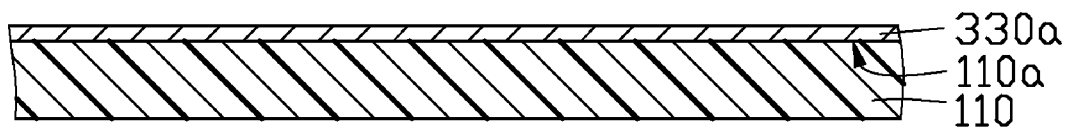
FIGS. 9-14 are partial cross-sectional views showing successive stages in one embodiment of a method for fabricating the light emitting module of FIG. 8.
Figure 10:
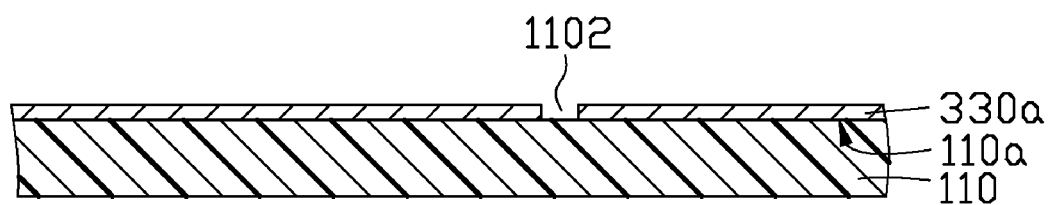

One embodiment of a method for fabricating the light emitting module 30 of FIG. 8 is similar to the method for fabricating the light emitting module 10 of FIG. 1, except that the step of positioning the solar cell unit 330 on the dielectric substrate 110 includes:

Referring to FIGS. 9 and 10, the rear electrode layer 330a is formed on the first surface 110a. A plurality of first spacing portions 1102 is defined in the rear electrode layer 330a so that a plurality of spaced rear electrode layers 330a are formed.

Figure 11:
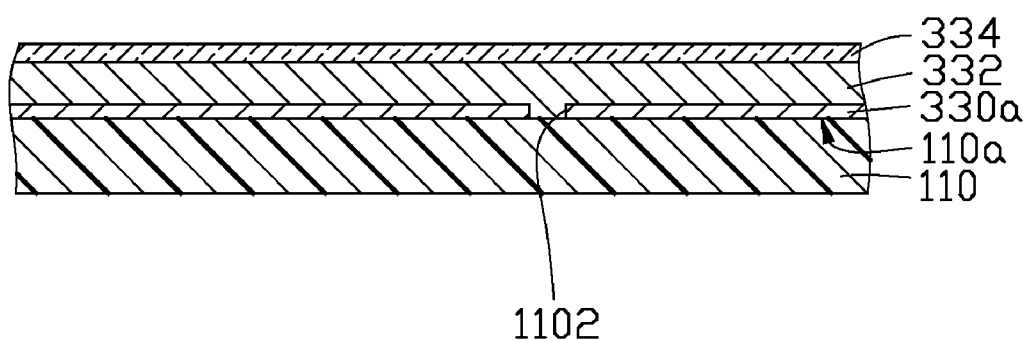
Figure 12:
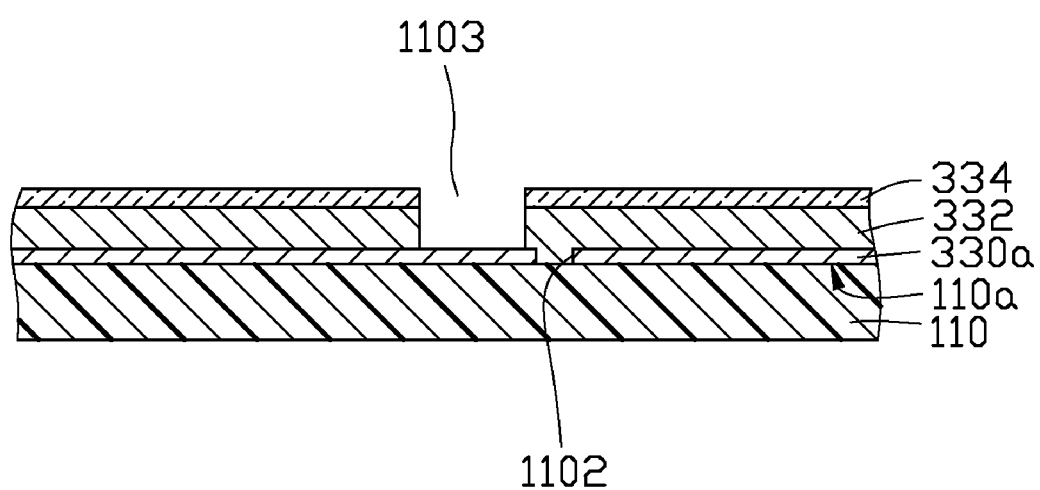

Referring to FIGS. 11 and 12, a photovoltaic semiconductor layer 332 and a transparent conductive layer 334 are formed on the plurality of spaced rear electrode layers 330a. A plurality of second spacing portions 1103 is defined in the photovoltaic semiconductor layer 332 and the transparent conductive layer 334 so that a plurality of spaced photovoltaic semiconductor layers 332 and a plurality of spaced transparent conductive layers 334 are formed. Each second spacing portion 1103 is adjacent to a corresponding first spacing portion 1102.

Figure 13:
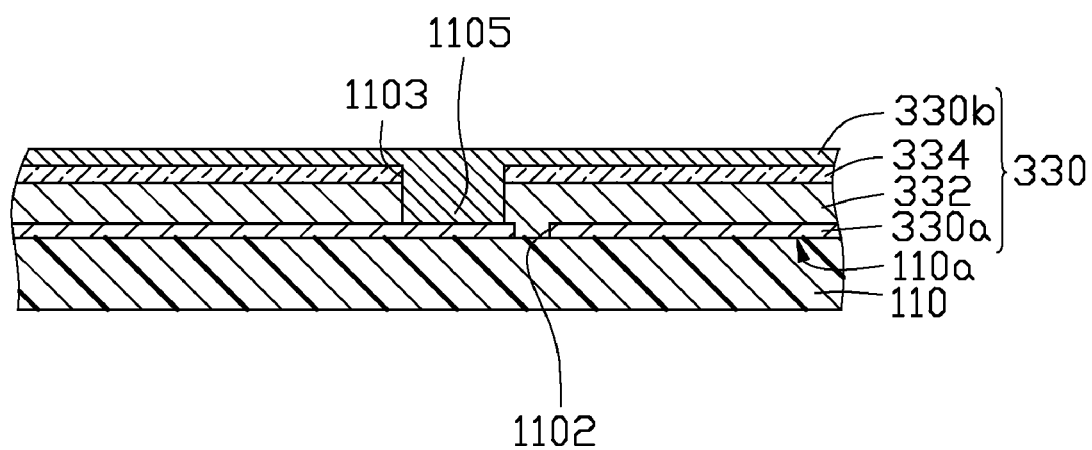
Figure 14:
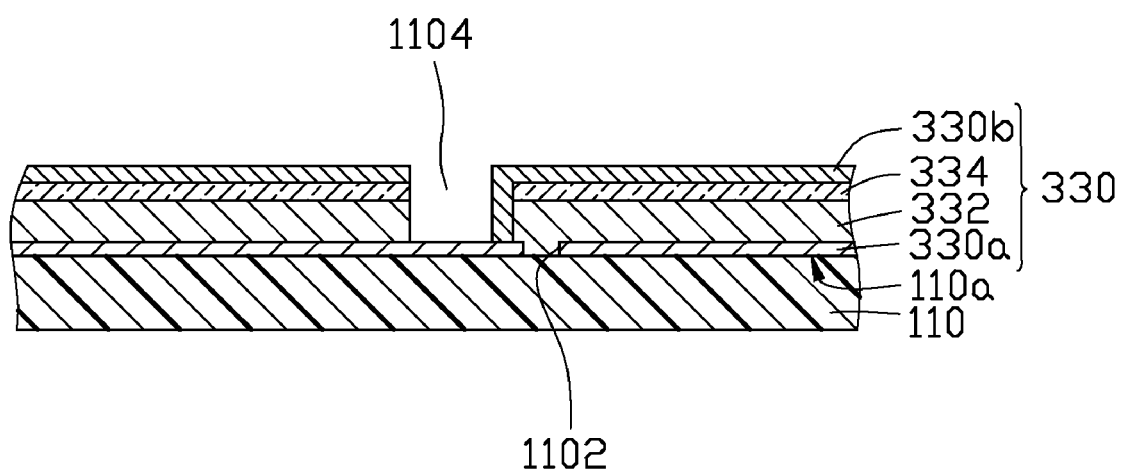

Referring to FIGS. 13 and 14, a front electrode layer 330b is formed on the plurality of spaced transparent conductive layer 334 and positioned in the plurality of second spacing portion 1103. As a result, the front electrode layer 330b forms a plurality of connection portions 1105 in the plurality of second spacing portions 1103. The plurality of connection portions 1105 contacts the plurality of spaced rear electrode layers. A plurality of third spacing portions 1104 is defined in the plurality of connection portions 1105 so that a plurality of spaced front electrode layers 330b are formed and a rear electrode layer 330a of a solar cell unit 330 is electrically coupled to a front electrode layer 330b of an adjacent solar cell unit 330.

The first, second and third embodiments of the light emitting module have compact and thin structures, and are easily manufactured.

It is believed that the present embodiments and their advantages will be understood from the foregoing description, and it will be apparent that various changes may be made thereto without departing from the spirit and scope of the invention or sacrificing all of its material advantages, the examples here before described merely being preferred or exemplary embodiments of the invention.

What is claimed is:

1. A light emitting module, comprising:
a dielectric substrate having a first surface and a second surface opposite to the first surface;
a solar cell unit positioned on the first surface;
a metal pattern layer positioned on the second surface;
a plurality of light emitting units positioned on the metal pattern layer; and
a power storage component comprising a power charge port electrically coupled to the solar cell unit, and a power supply port electrically coupled to the metal pattern layer;
wherein the metal pattern layer comprises a plurality of pairs of electrode pads; each pair of electrode pads is coupled to a corresponding light emitting unit and comprises a positive electrode pad and a negative electrode pad connected to a positive electrode pad of an adjacent pair of electrode pads.

2. The light emitting module of claim 1, further comprising a transparent package component positioned on the dielectric substrate and enclosing the solar cell unit.

3. The light emitting module of claim 1, wherein the solar cell unit sequentially comprises a rear electrode layer contacting the first surface, a photovoltaic semiconductor layer, a transparent conductive layer, and a front surface electrode; the rear electrode layer and the front surface electrode are electrically coupled to the power charge port.

4. The light emitting module of claim 3, wherein the photovoltaic semiconductor layer comprises of an N-type semiconductor layer, a P-type semiconductor layer, and a PN junction layer formed between the N-type semiconductor layer and the P-type semiconductor layer.

5. The light emitting module of claim 3, wherein the front electrode layer is comb-shaped.

6. A method for fabricating a light emitting module, comprising:
positioning at least one solar cell unit on a first surface of a dielectric substrate;
positioning a metal pattern layer on a second surface of the dielectric substrate;
positioning a plurality of light emitting units on the metal pattern layer, the metal pattern layer comprising a plurality of pairs of electrode pads each pair of electrode pads being coupled to a corresponding light emitting unit and comprising a positive electrode pad and a negative electrode pad connected to a positive electrode pad of an adjacent pair of electrode pads; and
coupling a power storage component between the solar cell unit and the metal pattern layer.

7. The method of claim 6, further comprising positioning a transparent package component on the dielectric substrate to enclose the at least one solar cell unit.

8. The method of claim 6, wherein the at least one solar cell unit comprises one solar cell unit.

9. The method of claim 8, wherein positioning one solar cell unit on the first surface of the dielectric substrate comprises sequentially positioning a rear electrode layer, a photovoltaic semiconductor layer, a transparent conductive layer, and a front electrode layer on the first surface.

10. The method of claim 9, wherein coupling a power storage component between the solar cell unit and the metal pattern layer comprises:
coupling a power charge port of the power storage component with the solar cell unit; and
coupling a power supply port of the power storage component with the metal pattern layer.

* * * * *